United States Patent
Bock

(10) Patent No.: US 7,196,645 B2
(45) Date of Patent: Mar. 27, 2007

(54) METHOD AND COMPENSATION DEVICE FOR COMPENSATION OF CHARACTERISTIC ERRORS OF AN ANALOG-DIGITAL CONVERTER

(75) Inventor: Christian Bock, Freiburg (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 11/249,029

(22) Filed: Oct. 11, 2005

(65) Prior Publication Data

US 2006/0077081 A1   Apr. 13, 2006

(30) Foreign Application Priority Data

Oct. 8, 2004 (DE) ........................ 10 2004 049 348

(51) Int. Cl.
*H03M 1/10* (2006.01)

(52) U.S. Cl. ........................ 341/120; 341/155

(58) Field of Classification Search ............... 341/155, 341/120, 118

See application file for complete search history.

(56) References Cited

U.S. PATENT DOCUMENTS

| | | | |
|---|---|---|---|
| 4,996,530 A | 2/1991 | Hilton | 341/120 |
| 5,179,379 A * | 1/1993 | Allen et al. | 341/118 |
| 5,210,735 A * | 5/1993 | Hoshino et al. | 369/53.13 |
| 5,594,612 A | 1/1997 | Henrion | 341/120 |
| 5,870,041 A | 2/1999 | Lee et al. | 341/118 |
| 6,038,518 A * | 3/2000 | Farwell | 702/89 |
| 6,195,031 B1 * | 2/2001 | Feld et al. | 341/159 |
| 6,198,416 B1 | 3/2001 | Velazquez | 341/118 |
| 6,445,317 B2 | 9/2002 | Lundin et al. | 341/120 |
| 2004/0233083 A1 | 11/2004 | Temerinac et al. | 341/120 |

\* cited by examiner

*Primary Examiner*—Peguy JeanPierre
(74) *Attorney, Agent, or Firm*—O'Shea, Getz & Kosakowski, PC

(57) ABSTRACT

To compensate for errors during the conversion of an analog input signal into a digital output signal in an analog-to-digital converter (ADC), an error of the digital output signal is corrected during operation of the ADC by a compensation device that utilizes stored correction values. The stored correction values may be changed in a predetermined manner or statistically by a certain magnitude. The particular changed correction value may be adopted if a quality criterion of the corrected output signal becomes better than the previous value, or may be rejected if the quality criterion of the corrected output signal becomes worse than the previous value. In the latter case, the respective original correction value is again placed in the table of correction values. In this way, a quasi-adaptive adjustment of the correction data is implemented during the operation of the device.

23 Claims, 2 Drawing Sheets

METHOD AND COMPENSATION DEVICE FOR COMPENSATION OF CHARACTERISTIC ERRORS OF AN ANALOG-DIGITAL CONVERTER

PRIORITY INFORMATION

This patent application claims priority from German patent application 10 2004 049 348.0 filed Oct. 8, 2004, which is hereby incorporated by reference.

BACKGROUND OF THE INVENTION

The invention relates to the field of analog-to-digital converters and in particular to compensating for errors in the analog-to-digital conversion process.

An analog-to-digital converters (ADC) transforms an analog input signal, preferably an electrical voltage or an electrical current, with a generally constant sampling frequency into a digital output signal (i.e., a data word), usually a digital voltage sequence or a digital current sequence.

A real-world ADC does not have an ideal transfer function (i.e., its characteristic is not ideal). Deviations lead to unwanted cross-modulation and intermodulation products. The deviations from such an ideal characteristic can be quantified by characteristic quantities. These quantities, which characterize the deviations from the ideal characteristic curve, include the differential nonlinearity (DNL) and integral nonlinearity (INL). DNL means the maximum step width error, and INL means the error between the quantized value and the ideal continuous value.

To reduce the characteristic errors, that is the errors which occur in the analog-to-digital conversion due to the deviations from the ideal characteristic curve, it is known from the prior art how to add, in the case of a known characteristic, a correction value (positive or negative) depending on the input signal or the output signal, to the digital output signal. This correction value is obtained, for example, from a table that contains the correction value corresponding (preferably) to every possible input signal or every possible group of input signals or to every output signal that can be converted from the input signal or every group of output signals.

The characteristic (i.e., the conversion or transformation function) of an ADC can be found by applying a defined and known input signal. One usually employs signal ramps (e.g., voltage ramps), triangular or sine signals (e.g., voltages with triangular or sinusoidal amplitude) to determine the conversion or transformation function of the ADC. U.S. Patent Application 2004/0233083 discloses a compensation circuit that determines the conversion or transform function using a sine signal applied at the input. At the output, the transformed output signal is compared to a reconstructed ideal sine signal. The parameters for amplitude, phase, and DC voltage component (offset) of this reconstructed sine signal are obtained from the transformed output signal. The values for the correction table are found from the differences, dependent on the input signal, between the transformed output signal and the reconstructed sine signal.

These techniques measure the characteristic of an ADC either for: (i) a quasi-static signal (e.g., in the case of a slow signal ramp), (ii) a particular signal gradient (e.g., in the case of a triangular signal) or (iii) a particular frequency (e.g., in the case of the sinusoidal signal). But depending on how the ADC operates, its characteristic is dependent on frequency or gradient. If the input signal (useful signal) includes alternating or a plurality of dominant frequency components, a compensation that relies on a single measurement frequency or a single signal gradient cannot be optimal.

Furthermore, when determining the conversion or transformation function, one often factors out ranges with very high input signal amplitudes (e.g., maximum positive input voltages or minimum negative input voltages) and replaces the correction values of these amplitude ranges in the correction table with values computed from neighboring ranges. This, as well, leads to a suboptimal error compensation.

A further drawback results from the thermal dependency of a real-world circuit. The longer an ADC is in operation, the more its characteristic differs from the one measured when the converter is switched on. A second measurement would entail an interruption in service, which in many instances is undesirable or even impossible (e.g., when the converter is part of a radio or television set).

U.S. Pat. No. 4,996,530 discloses a continuous self-calibration method and device based on statistical principles. One supplies a random noise signal to the input of a system, in particular, an ADC. The function of the output signal occurring at the output of the system is statistically analyzed by correlating the output signal with the random noise signal supplied at the input. An error correction is then performed for the output signal as the result of the correlation. This technique has the advantage over those described above that an error correction with high precision is possible, one which accounts for the current operating state (e.g., the temperature at the moment) of the converter and the associated transform function. However, this technique is comparatively expensive and generally requires many computation operations, so that it is only of limited use in ADCs.

U.S. Pat. No. 5,594,612 discloses a technique for correction of nonlinearity in an analog-to-digital conversion process. In particular, this patent advocates the use of a two-tone input signal to determine the correction values ("compensation coefficients"). Although this technique may lead to more reliable compensation of characteristic errors than the above-presented method based on a single measurement frequency, still this technique is again suboptimal for frequency or gradient-dependent converter characteristics. Furthermore, the (thermal) behavior of the converter as a function of its operating time is not taken into account.

U.S. Pat. No. 5,870,041 discloses an ADC with digital compensation in which, in an operating mode to calculate calibration values, correction values ("calibration values") are calculated in a multi-step process and used in a normal operating mode for correction of the output signal. This technique is comparatively expensive and does not it take into account, for example, the temperature function of the ADC.

There is a need for an improved technique that compensates for characteristic errors of an ADC.

SUMMARY OF THE INVENTION

To compensate for errors during the conversion of an analog input signal into a digital output signal in an analog-to-digital converter (ADC), an error of the digital output signal is corrected during operation of the ADC by correction values kept in a table.

The correction values may be generated and possibly rejected once again by trial and error.

The correction values kept in the table are changed in a predetermined manner or statistically by a certain magnitude. The particular changed correction value may be adopted if a quality criterion of the corrected output signal becomes better, or rejected if the quality criterion of the corrected output signal becomes worse. In the latter case, the respective original correction value is again placed in the table of correction values. In this way, a quasi-adaptive adjustment of the correction data is implemented during the operation of the device.

In a compensation device that is used to compensate for errors during the conversion of the analog input signal into the digital output signal in the ADC and which corrects an error of the output signal during a normal operation of the ADC by correction values kept in a table, the correction values in the table may be changed in a predetermined manner or statistically by a certain magnitude, and the particular changed correction value is retained if the quality criterion of the corrected output signal becomes better. If the quality criterion does not indicate improvement the particular original correction value is used once again.

To determine the quality criterion, a comparison of an auxiliary output signal to an auxiliary input signal, an influencing of the auxiliary output signal by the useful input signal, or an influencing of the useful output signal by the auxiliary input signal of the ADC can be used. This auxiliary signal can be, in particular, an auxiliary signal that is mixed in without disturbing the useful signal. For example, if the variation of the correction value produces an improved conversion of the auxiliary signal or a reduced influencing between the useful and the auxiliary signal, the corresponding correction value will be retained, and in the contrary case, rejected.

The magnitude and sign of the particular change in the instantaneous correction value may be varied in dependence on a ratio formed from the number of altered and retained correction values and the number of original correction values used once again within a particular interval of time. In this way, the degree of the variation is adapted to the gradual approaching of the ideal converter function.

As an alternative or in addition to this, the magnitude and sign of the particular change in the instantaneous correction value may be varied in dependence on a length of operation of the ADC. Thus, for example, one can allow larger changes at the start of the operation, in order to quickly correct large deviations from the ideal converter function, whereas only slight variations in the correction values are permitted during longer operation, since one can then assume an extensive adaptation to have taken place and only slight thermal effects need to be taken into account.

In another embodiment, the magnitude and the sign of the particular change in the instantaneous correction value may be varied in dependence on a degree of attainment of a quality yardstick. When the quality yardstick is attained, one assumes that a far-reaching adaptation has already taken place. Therefore, large changes in the corresponding correction value in a later step can lead to an impairment of the output signal. In this case, it is advisable to undertake smaller or no changes to the correction value in the next step. To determine the quality yardstick, a set value of the quality criterion may be used. A multistage quality yardstick may also be used.

From the mathematical derivation of the quality criterion of the output signal, in particular, the useful signal or the auxiliary signal, after the change in the correction values (coefficients), one can determine an improvement gradient for the correction values (coefficients). The degree and direction (i.e., the magnitude and sign) of the variation can also be adapted to this information.

In another embodiment, the correction value (coefficient) that is adopted is no longer necessarily identical to the correction value that was used during the trial for changing the set of coefficients. Instead, the correction value adopted can be larger or smaller or even have a different sign than the correction value tested during the trial and error.

In another embodiment, the effect of changing the correction value is tested in both directions. The quality criterion is used to judge the direction in which the correction value being adopted should deviate from the previously valid one.

In another embodiment, before adopting one or more new coefficients, the effects of the changing of various coefficients are tested, individually or at the same time. Quality criteria for the output signal, in particular, the useful signal or any mixed-in auxiliary signal being used, can be: (i) a degree of influencing of the useful signal by the auxiliary signal or vice versa, (ii) a degree of suppression of harmonics of carrier frequencies of the output signal, (iii) a degree of suppression of a cross-modulation for several carrier frequencies of the output signal, or (iv) a degree of increasing of the eye openings of the output signal in digital modulation methods, such as QPSK, QAM.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
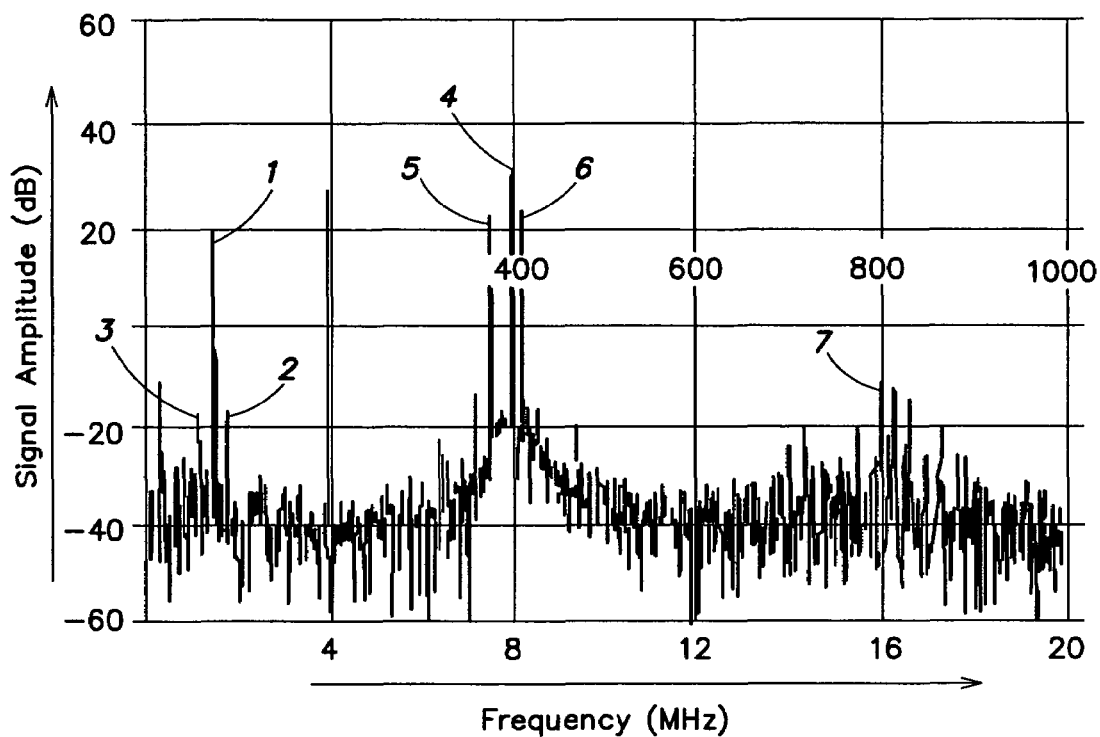
FIG. 1 illustrates a spectrum of a television signal at 8 MHz in inverted sideband, plotted in dB against an arbitrary reference.

FIG. 1 illustrates a plot from a simulation of a spectrum of a simple model of a television signal in inverted sideband. A picture carrier 4 of the television signal is at 8 MHz. Sidebands 5 and 6 are produced by amplitude modulation of the picture carrier. A sound carrier 1 is at a distance of −6.5 MHz from the picture carrier 4. Adjacent to the originally unmodulated sound carrier 1 at 1.5 MHz are sidebands 2, 3 due to cross-modulation of the amplitude modulation of the picture carrier 4. A first harmonic 7 of the picture carrier 4 is situated at 16 MHz, which corresponds to twice the frequency of the picture carrier 4. According to an aspect of the invention a compensation device measures and compensates by reducing the cross-modulation and intermodulation caused by the nonlinearities of the characteristic, such as the sidebands 2, 3 produced by the cross-modulation and the harmonic 7 of the picture carrier 4, and thus provides an approximately ideal characteristic for the current useful signal.

Figure 2:
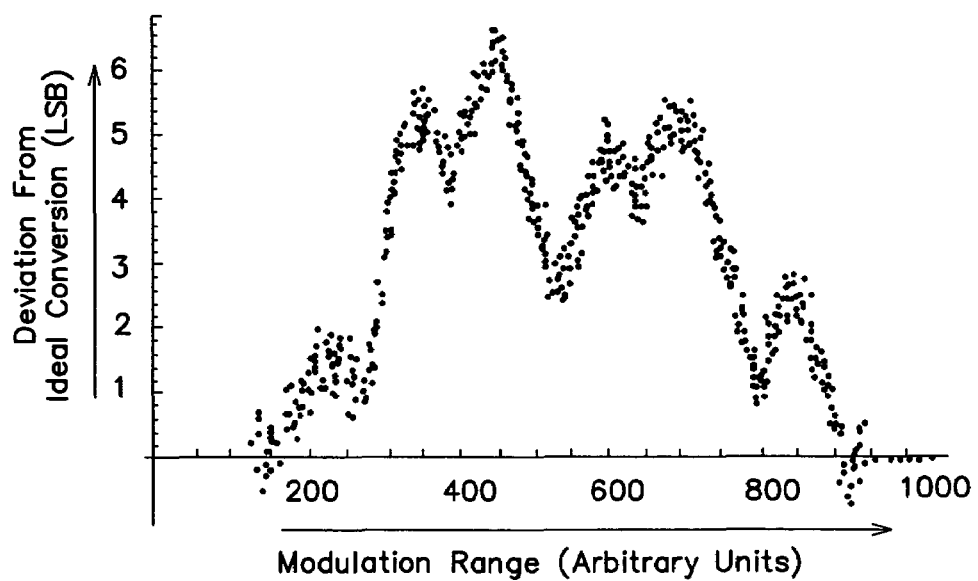
FIG. 2 is a typical INL characteristic of an analog-to-digital converter, measured with a sine signal of constant frequency; on the abscissa is plotted the 10-bit modulation range; the ordinate shows the deviation in Least Significant Bits (LSBs) of the digital output signal from an ideal conversion of the analog sine signal.

FIG. 2 illustrates a typical INL characteristic of an ADC, measured with a sine of constant frequency, which modulates 85% of the converter. The deviation in LSBs of the digital output signal from an ideal conversion is plotted against the digital output signal. A compensation of this characteristic is correct only in proximity to the original measurement frequency.

Figure 3:
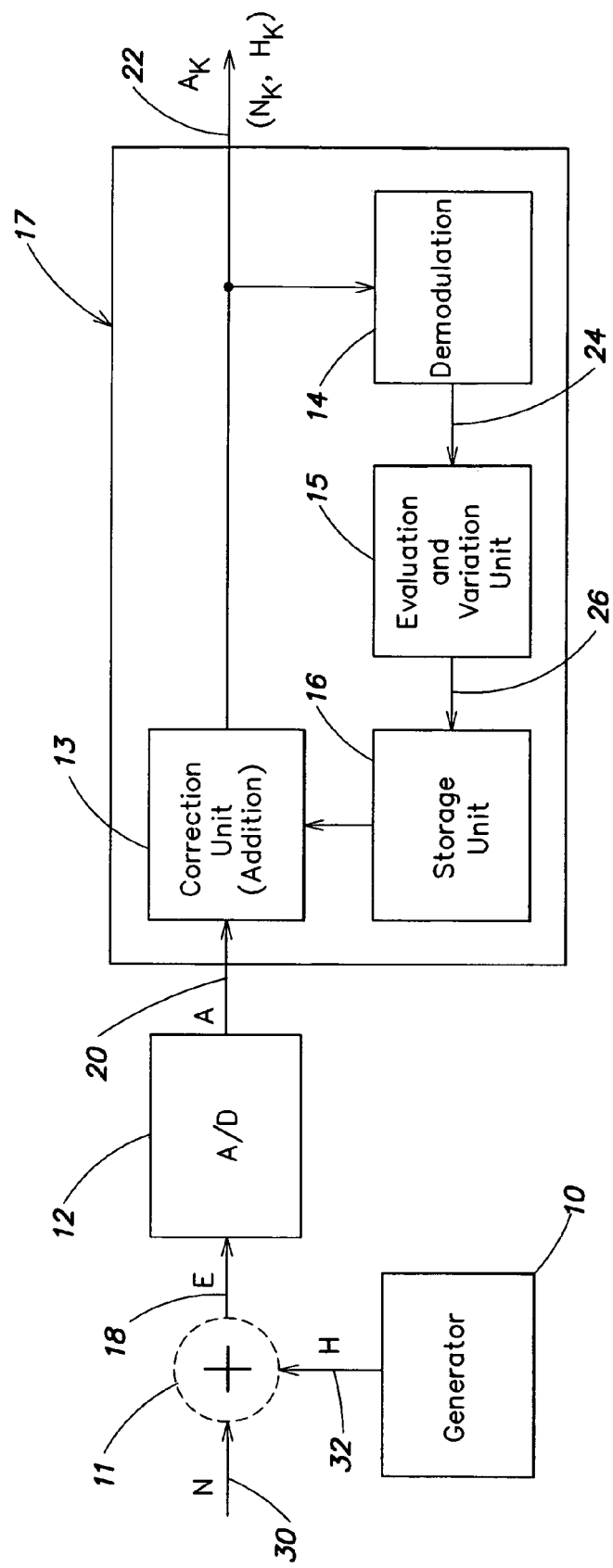
FIG. 3 is a block diagram of a device for compensating of errors in the conversion of an analog input signal into a digital output signal in an analog-to-digital converter.

FIG. 3 shows a block diagram of a device 17 that compensates for errors in the conversion of an analog input signal E on a line 18 into a digital output signal A on a line 20 in an analog-to-digital converter (ADC) 12.

The device 17 includes a correction unit 13 that receives the digitized signal A on the line 20, and provides a corrected digitized output signal $A_k$ on a line 22. The digitized output signal on the line 22 is input to a demodulator 14, which provides a demodulated signal on a line 24 to an evaluation and variation unit 15 that provides an output on line 26 to a storage unit 16. An output of the storage unit 16 is the input to the correction unit 13.

Addition unit 11 receives an analog useful signal on a line 30, and optionally may receive an analog auxiliary signal H on a line 32 produced by a generator 10. Therefore, the signal on the line 18 includes the individual signals N on the line 30 and possibly also the signal H on the line 32. This sum signal E on the line 18 represents the analog input signal E of the ADC 12.

Due to the non-ideal converter function (characteristic error) of the ADC 12, the digital output signal on the line 20 will deviate from the ideally desired digital output signal. For this reason, the ADC 12 is connected to the aforesaid correction device 13, which furnishes a corrected output signal $A_k$ on the line 22 that is composed ideally of the sum of the digitized corrected input signal components, namely, the digitized corrected useful signal $N_k$ and the digitized corrected auxiliary signal $H_k$.

The correction of the output signal on the line 20 is based on correction values kept in a table. For this purpose, a storage unit 16 is provided, where this table of correction values is kept.

The correction values kept in the table storage 16 are continuously varied in a predetermined manner or statistically varied by a magnitude and the particular changed correction value is adopted if the corrected output signal $A_k$ shows an improved quality criterion and the respective original correction value is used once again if the corrected output signal $A_k$ shows a worse quality criterion. The evaluation and variation unit 15 is responsible for this evaluation and variation of the correction values.

The quality criterion or criteria used to judge the corrected output signal $A_k$, in particular the corrected auxiliary signal $H_k$ and/or the corrected useful signal $N_k$, is produced by the demodulator 14, which can measure the desired quality criterion such as suppression of cross-modulation or harmonics in the case of analog modulations or increasing of the eye openings in digital modulations to assess the reaching of a quality yardstick. The demodulator may employ amplitude demodulation of a second useful or auxiliary carrier to measure cross-modulation by an amplitude-modulated first useful or auxiliary carrier. In the case of television signals by the analog standard, the amplitude demodulated sound carrier can be specifically investigated by portions of the line or picture synchronization signal of the amplitude modulated picture carrier. The demodulator may also employ frequency demodulation of a second useful or auxiliary carrier to measure cross-modulation by a frequency modulated first useful or auxiliary carrier. Similarly, the demodulator may employ frequency-selective measuring of possibly expected harmonics and spurious waves at certain frequencies. This measuring can be done by known methods, such as bandpass filtering and rectification or by down-mixing, low-pass filtering, and amplitude determination. The demodulator may also employ complex demodulation with clock and phase synchronization and determination of the eye opening for QAM-modulated digital signals.

Although the present invention has been illustrated and described with respect to several preferred embodiments thereof, various changes, omissions and additions to the form and detail thereof, may be made therein, without departing from the spirit and scope of the invention.

What is claimed is:

1. A method for compensation of errors during the conversion of an analog input signal provided at an input of an analog-to-digital converter into a digital output signal at an output of the analog-to-digital converter, comprising the steps of:

providing a plurality of stored correction values;

varying at least one of the stored correction values in a predetermined manner to provide a varied correction value;

correcting the digital output signal by the varied correction value to provide a corrected digital output signal; and demodulating the corrected digital output signal to provide a quality signal;

subsequently correcting the digital output signal utilizing the varied correction value if the quality signal of the corrected digital output signal meets a predetermined characteristic, otherwise subsequently correcting the digital output signal utilizing one of the plurality of correction values other than the varied correction value if the quality signal of the corrected digital output signal does not meet the predetermined characteristic.

2. The method of claim 1, where the corrected digital output signal comprises a useful signal.

3. The method of claim 1, where the corrected digital output signal comprises a useful signal mixed with an auxiliary signal.

4. The method of claim 1, where the step of varying comprises the step of varying at least one of the stored correction values in a statistical manner.

5. The method of claim 1, where the predetermined characteristic comprises a degree of accuracy of the corrected digital output signal to the analog input signal.

6. The method of claim 1, where the predetermined characteristic comprises a degree of suppression of harmonics of carrier frequencies in the corrected digital output signal.

7. The method of claim 1, where the predetermined characteristic comprises a degree of suppression of a cross-modulation for several carrier frequencies in the corrected digital output signal.

8. The method of claim 1, where the predetermined characteristic comprises a degree of increasing of eye opening of the corrected digital output signal.

9. The method of claim 1, further comprising the step of varying a magnitude and sign of the varied correction value utilized at an instant in time in dependence on a ratio formed from a number of varied correction values utilized and a number of the correction values other than the varied correction value utilized within a particular interval of time.

10. The method of claim 1, further comprising the step of varying a magnitude and sign of the varied correction value in dependence on an operating period of the analog-to-digital converter.

11. The method of claim 1, further comprising the step of varying magnitude and sign of the varied correction value in dependence on a degree of attainment of predetermined quality measurement.

12. A device for compensation of errors in the conversion of an analog input signal provided at an input of an analog-to-digital converter into a digital output signal at an output of the analog-to-digital converter, comprising:
- a storage unit that stores a plurality of correction values;
- an evaluation and variation unit that varies at least one of the stored correction values in a predetermined manner to provide a varied correction value;
- a correction unit that corrects the digital output signal by the varied correction value to provide a corrected digital output signal; and
- a demodulator, responsive to the corrected digital output signal, that provides a signal indicative of a quality criterion of the digital output signal to the evaluation and variation unit,
- where the varied correction value is utilized for a subsequent correction of the digital output signal if the quality criterion of the corrected digital output signal meets a predetermined characteristic, and otherwise where one of the plurality of correction values other than the varied correction value is utilized for a subsequent correction of the digital output signal if the quality criterion of the corrected digital output signal does not meet the predetermined characteristic.

13. The device of claim 12, where the corrected digital output signal comprises a useful signal.

14. The device of claim 12, where the corrected digital output signal comprises an auxiliary signal mixed with useful signal.

15. The device of claim 12, where the evaluation and variation unit varies at least one of the stored correction values in a statistical manner to provide the varied correction value.

16. The device of claim 12, where the predetermined characteristic comprises a degree of accuracy of the corrected digital output signal to the analog signal.

17. The device of claim 12, where the quality criterion of the corrected digital output signal comprises a degree of suppression of harmonics of carrier frequencies in the corrected digital output signal.

18. The device of claim 12, where the quality criterion of the corrected digital output signal comprises a degree of suppression of a cross-modulation for several carrier frequencies in the corrected digital output signal.

19. The device of claim 12, where the quality criterion of the corrected digital output signal comprises a degree of increasing of eye opening of the corrected digital output signal.

20. The device of claim 19, where the evaluation and variation unit varies a magnitude and sign of the varied correction value in dependence on a ratio formed from a number of varied correction values utilized and a number of the correction values other than the varied correction value utilized within a particular interval of time.

21. The device of claim 19, where the evaluation and variation unit varies a magnitude and sign of the varied correction value in dependence on an operating period of the analog-to-digital converter.

22. A method for compensating for errors that occur during the conversion of an analog input signal provided at an input of an analog-to-digital converter into a digital output signal at an output of the analog-to-digital converter, comprising the steps of:
- storing a plurality of correction values;
- iteratively varying at least some of the correction values in a predetermined manner to provide corresponding varied correction values; and
- correcting the digital output signal by a selected one of the varied correction values to provide a corrected digital output signal, where the digital output signal is corrected utilizing a first particular one of the varied correction values if a quality criterion based on a demodulated version of the corrected digital output signal meets a predetermined characteristic, otherwise the digital output signal is corrected utilizing a second particular one of the plurality of correction values if the quality criterion of the corrected digital output signal does not meet the predetermined characteristic.

23. A device that compensates for errors that occur in the conversion of an analog input signal provided at an input of an analog-to-digital converter into a digital output signal at an output of the analog-to-digital converter, comprising:
- a storage unit that stores a plurality of correction values;
- an evaluation and variation unit that varies at least some of the stored correction values in a predetermined manner to provide corresponding varied correction values;
- a correction unit that iteratively corrects the digital output signal by a selected one of the varied correction values to provide a corrected digital output signal; and
- a demodulator, responsive to the corrected digital output signal, that provides a signal indicative of a quality criterion of the digital output signal to the evaluation and variation unit,
- where the correction unit corrects the digital output signal utilizing a first particular one of the varied correction values if the quality criterion of the corrected digital output signal meets a predetermined characteristic, and where the correction unit otherwise corrects the digital output signal utilizing a second particular one of the varied correction values if the quality criterion of the corrected digital output signal does not meet the predetermined characteristic.

* * * * *

UNITED STATES PATENT AND TRADEMARK OFFICE
CERTIFICATE OF CORRECTION

PATENT NO. : 7,196,645 B2 Page 1 of 1
APPLICATION NO. : 11/249029
DATED : March 27, 2007
INVENTOR(S) : Christian Bock It is certified that error appears in the above-identified patent and that said Letters Patent is hereby corrected as shown below:

Column 1
Line 17, delete "converters" and insert --converter--

Column 6
In the claims, claim 11, line 65, before "magnitude" insert --a--
In the claims, claim 11, line 66, before "predetermined" insert --a--

Column 7
In the claims, claim 14, line 29, before "useful" insert --a--

Signed and Sealed this

Nineteenth Day of February, 2008

JON W. DUDAS
*Director of the United States Patent and Trademark Office*